United States Patent [19]

Toyoda et al.

[11] Patent Number: 5,267,825
[45] Date of Patent: Dec. 7, 1993

[54] CARRIER DEVICE

[75] Inventors: Sei-ichiro Toyoda; Sadao Funyu; Tetsuo Kashiwazaki; Kazuo Fujita; Kazunori Sasage; Teijiro Yamamoto, all of Yokohama, Japan

[73] Assignee: Ono Sokki Co., Ltd., Japan

[21] Appl. No.: 721,695

[22] Filed: Jun. 26, 1991

[30] Foreign Application Priority Data

Jul. 13, 1990 [JP] Japan .................................. 2-185777

[51] Int. Cl.⁵ ............................................ B65G 65/00
[52] U.S. Cl. .................................. 414/752; 198/750; 198/468.4
[58] Field of Search ............... 414/225, 752; 198/750, 198/749, 468.4, 811, 689.11, 748; 269/21, 309

[56] References Cited

U.S. PATENT DOCUMENTS 3,484,093 12/1969 Mermelstein .......................... 269/21
3,711,081 1/1973 Cachon ................................. 269/21
3,955,163 5/1976 Novak .............................. 269/21 X Primary Examiner—David A. Bucci
Assistant Examiner—Donald W. Underwood
Attorney, Agent, or Firm—Lorusso & Loud

[57] ABSTRACT

The present invention provides a carrier which enables rapid, accurate positioning of work, while providing registration of the subsequent work piece. The carrier becomes at least a part of a processing table and includes sliding suction plates for holding and moving the work pieces between a registration station for positioning the work piece on a registration table and a processing station for processing the work piece while in a airtight chamber on the processing table. The carrier is characterized by a sealing mechanism for sealing the gap between the remaining sections of the processing table and the sliding suction plates when the sliding suction plates are located in the processing station. As a result, the airtight operation in the processing station is possible, and the carriage moves only the sliding suction plates. The carriage moves the work piece between the registration station and the processing station at a high speed.

9 Claims, 7 Drawing Sheets

CARRIER DEVICE

BACKGROUND OF THE INVENTION

1. Field of the Invention

This invention relates to a carrier device for carrying a work piece between a registration station and a processing station of an exposure apparatus, and more particularly to a carrier capable of both carrying the work piece into the processing station (e.g., contact exposure station) where an airtight chamber is formed and the work piece is processed under airtight conditions.

2. Description of the Prior Art

In the conventional method for transferring a circuit pattern to a printed circuit board from an original film, carrying the corresponding light-transmitted or flare pattern, the circuit board is exposed through the original film overlaid on the printed board. In this case, for the purpose of obtaining sufficient resolution, it was required to expose with parallel light or to bring the original film into contact with the printed circuit board.

In addition, for the purpose of automatically positioning the original form film and the printed circuit board, a method for registration of both is required (See Japanese Patent Laid-open No. 61-28153). This method involves placing the registration station for positioning and a registration table at different positions and carrying the original film positioned at the registration station to the registration table and then, likewise, carrying the printed circuit board positioned at the registration station to the registration table.

In the above-mentioned prior art, because the printed circuit board positioned at the registration station was carried by suspending it from an arm, there was a possibility of misregistration when picked-up with the arm.

In addition, the transfer from registration station to the registration position, as is, causes delay, and the position of the printed circuit board cannot be determined during exposure, resulting in poor working efficiency.

SUMMARY OF THE INVENTION

The object of the present invention is to provide a carrier device for resolving the preceding problem, accurately positioning one work piece, determining the registration of the subsequent work piece while processing the one work piece, and at the same time conducting the processing in an airtight chamber.

The carrier device of the present invention includes a sliding suction plate, for aspirating and holding a work piece, which moves between a registration station where the work piece is positioned on a registration table and a processing station for processing the work piece on a processing table in an airtight chamber. The sliding suction plate maintains air-tightness and becomes at least a part of the processing table. A seal is provided for sealing the gap between the remaining portion of the processing table and the sliding suction plate when the sliding suction plate is located at the processing station.

On the basis of the present invention, when the sliding suction plate becomes a part of the processing table, the processing by exposure or the like can be conducted in an airtight chamber formed by the seal. In other words, when the sliding suction plate becomes a part of the processing table, the gap between them is sealed. As a result, airtight operation at the processing station is achieved. Therefore, the present invention has made it possible to move only the sliding suction plate and to carry the work piece between the registration station and the processing station at a high speed.

BRIEF DESCRIPTION OF THE DRAWINGS

The foregoing and other objects and features of the invention will become apparent from the following description of preferred embodiments of the invention with reference to the accompanying drawings, in which.

DETAILED DESCRIPTION OF THE PREFERRED EMBODIMENTS

A detailed description will be given of a carrier device of the present invention in an exposure device as shown in FIGS. 1A-1D. This exposure device comprises a registration station 1, an exposure station 2, a conveyor 3, a seal station 4, a releasing station 5 and a controller 6.

Figure 1A:
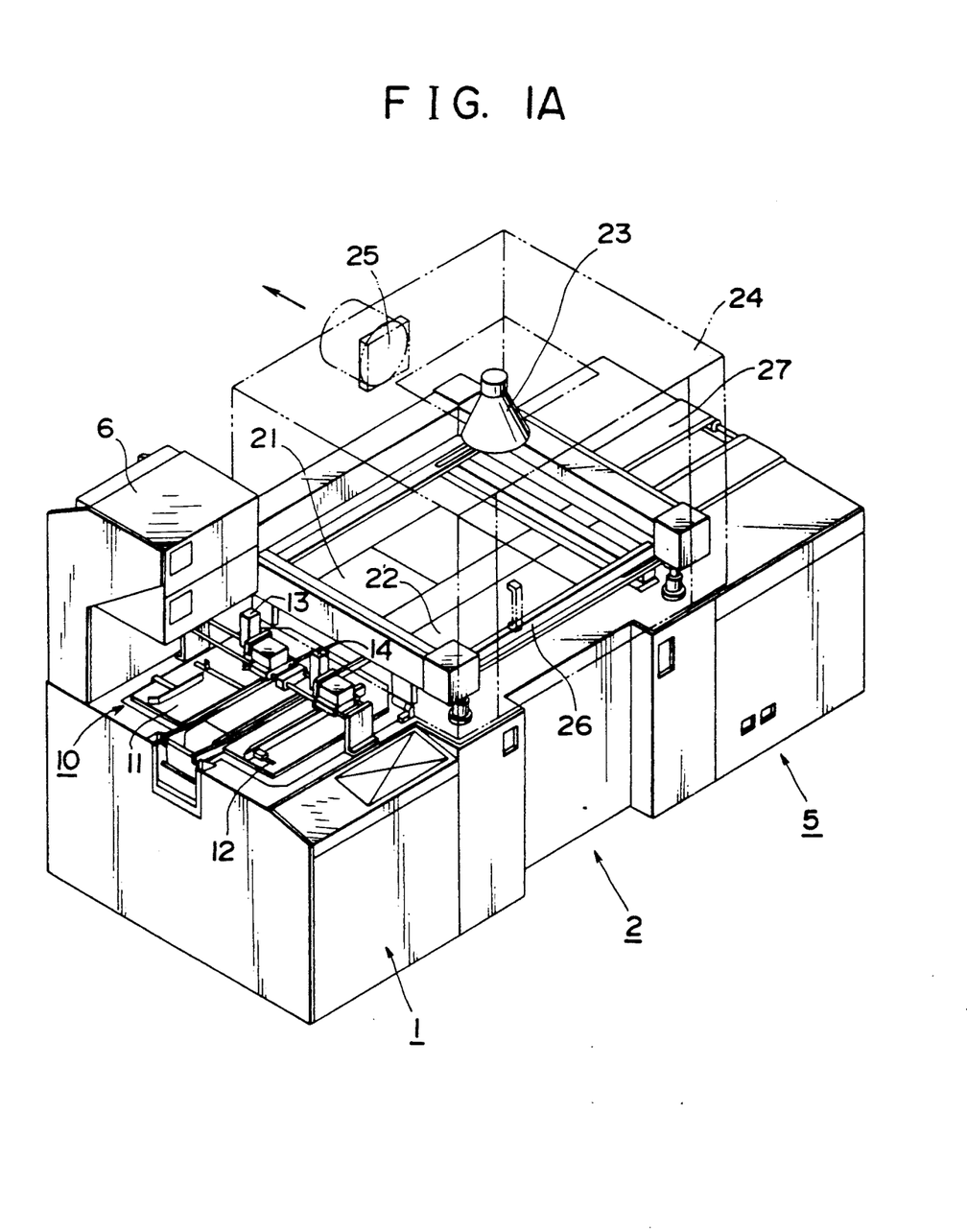
FIG. 1A is a perspective view showing a first preferred embodiment of the apparatus of the present invention.

The registration station 1 includes a registration table 10 arranged perpendicular to the direction of movement (in a line from the registration station 1, through the exposure section 2, to the release section 5) of a printed circuit board P. The registration table 10 is provided with first and second fixed suction plates 11, 12.

In the registration station 1, a registration mark set on the printed circuit board P is read by CCD cameras 13, 14 mounted above the registration table 10, and image processing is carried out by an image processing unit in the controller 6, on the basis of the read-out image of the registration mark, to generate a registration signal. A high speed and highly accurate alignment can be made by moving the printed circuit board P independently in X direction (the direction of the printed board P), Y direction (the direction perpendicular to the X direction within a horizontal plane) or θ direction (the angle of rotation about an axis defined by the table center), on the basis of the generated signal.

Figure 2A:
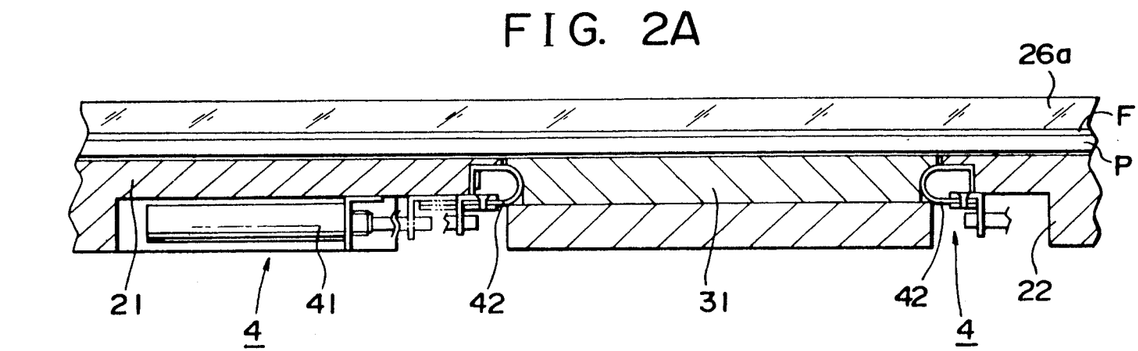
FIG. 2A is a sectional view of showing a seal portion of the first preferred embodiment of the present invention.

In the exposure station 2, third and fourth fixed suction plates 21, 22 are arranged at a similar interval and with a similar orientation as the first and second fixed suction plates 11 and 12, respectively. In the exposure station 2 an exposure lamp 23 exposes an original film F in contact with the printed circuit board P as shown in FIG. 2A. The exposure station 2 is covered with an exposure box 24, cooled air is fed into the exposure box 24 from the bottom and the hot air which rises by convection is exhausted to the outside of the exposure box 24 by a cooling fan 25. In this manner, a transparent support plate 26a composed of an acrylic plate on an exposure table 26 and the original form film F are prevented from thermally expanding. The exposure table 26 moves upwards or downwards and enables placement of an original film F, glued on the transparent support plate 26a, over the printed circuit board P.

Figure 1B:
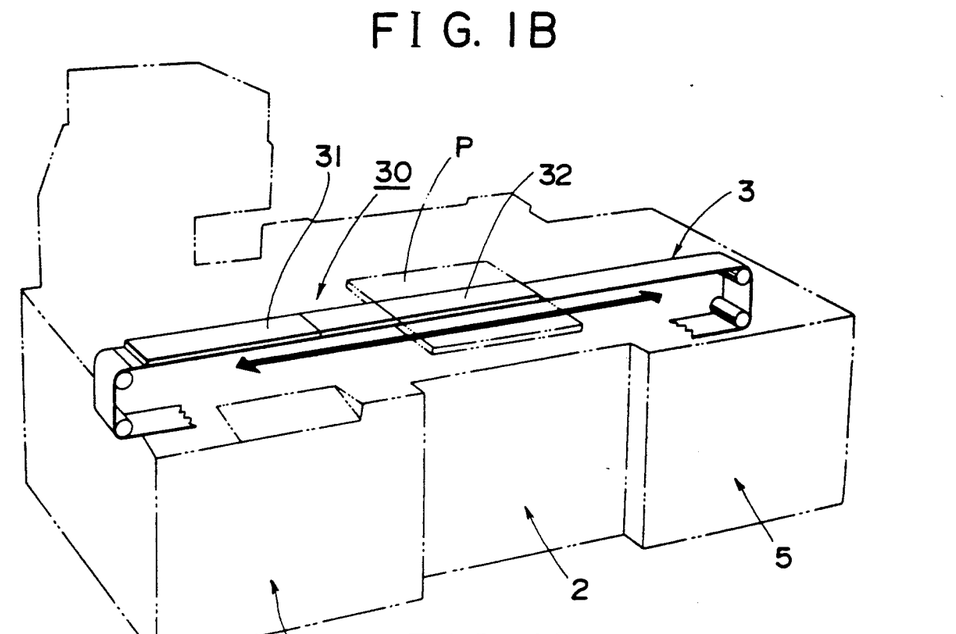
FIG. 1B is a perspective view showing the extracted carrier of the first preferred embodiment of the present invention.
Figure 1C:
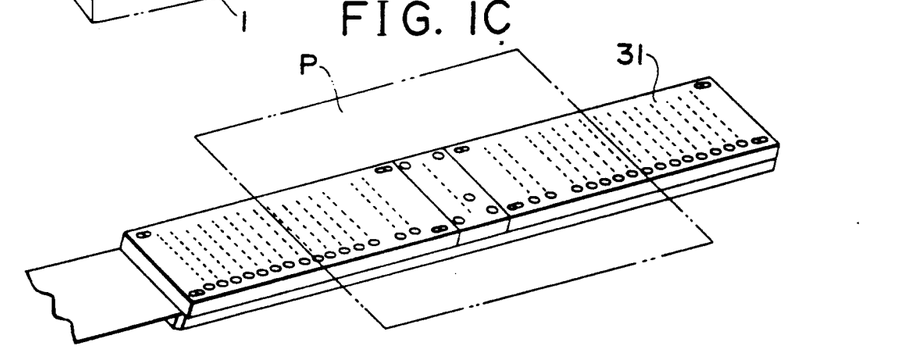
FIG. 1C is an enlarged perspective view showing the extracted carrier of the first preferred embodiment.
Figure 1D:
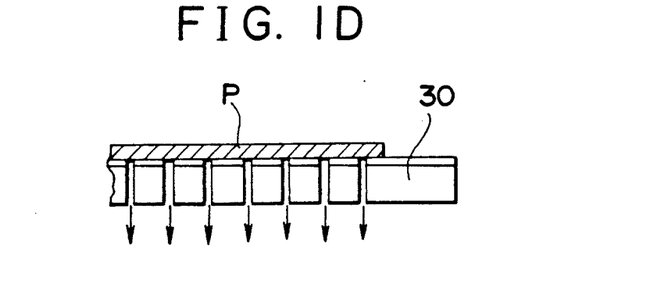
FIG. 1D is a sectional view of the extracted carrier of the first preferred embodiment.

The carrier 3 includes a carrier table 30 mounted in a wide channel between the first and second fixed suction plates 11, 12 and between the third and fourth fixed suction plates 21, 22. The carrier table 30 is composed of a sliding suction plate 31 for carrying in and a sliding suction plate 32 for carrying out. FIG. 1B shows the sliding suction plate 31 located on the registration table 10 and the sliding suction plate 32 located on the exposure table 26.

Figure 2B:
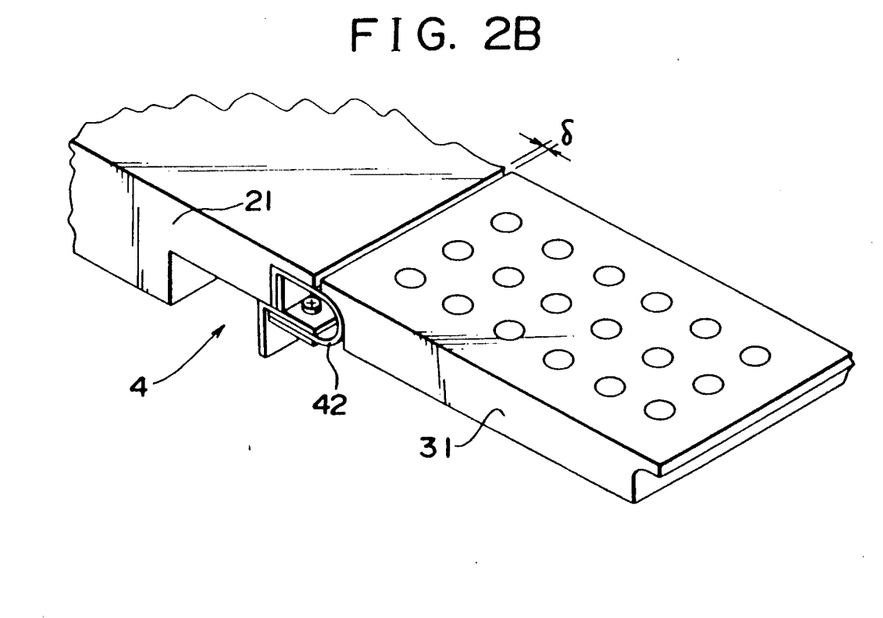
FIG. 2B is a perspective view of the seal portion of FIG. 2A.

The seal 4 seals the gap between the fixed suction plates 21, 22 of the exposure station 2 and the sliding suction plates 31, 32 of the carrier station 3. This seal 4 is installed on the lower side of the fixed suction plates 21, 22 and has a structure including a belt-like packing 42 of a length corresponding to that of the gap and is operated by the rod of an air cylinder 41, as shown in FIG. 2. When the rod of the air cylinder 41 extends, the packing 42 is extended to seal the gap between the fixed suction plate 21 and the sliding suction plate 32.

The release station 5 is for carrying the printed circuit board P exposed at the exposure station 2 to the next process. This can be either a stock station for the production line or a reversing device in case the back face of the printed circuit board P is to be exposed.

Now, the operation of the carrier device of present invention is described in conjunction with the exposure device.

In FIG. 1B, the sliding suction plate 31 is located at the registration station 1 and the sliding suction plate 32 is located at the exposure station 2 as shown in FIG. 1B. At the registration station 1, the original form film F is positioned on the fixed suction plates 11, 12. At this time, a pressure sensitive adhesive double coated tape is attached on the upper surface of the original form film F.

The sliding suction plate 31 is carried to the exposure station 2 with the original form film F thereon. At this position, the exposure table 26 is lowered and the original form film F is attached on the transparent support plate 26a of the exposure table 26 by the pressure sensitive adhesive double coated tape. Then, the original form film F is firmly fixed by means of the fixed tape by raising the exposure table 26 and lifting it up at the front. Instead of adhesion by tape, a suction channel may be provided on the surface of the transparent support plate 26a to make the original form film F adhere by vacuum. The above-mentioned positioning of the original form film F and the gluing of it on the exposure table 26 are an operation at the preparatory stage to be carried out in advance of the exposure of the board and are done one time only, independently of the exposure process.

Subsequently, the sliding suction plate 31 returns to the registration station 1 and picks up the unexposed printed circuit board P by suction to carry it to the exposure station 2.

Thereafter, the exposure table 26 is lowered and the original form film F is put on the printed circuit board P held by the sliding suction plate 31. At this position, the original form film F and the printed circuit board P are accurately positioned.

At this time, the rod of the air cylinder 41 in the sealing mechanism 41 extends and the gaps between fixed suction plates 21, 22 and the sliding suction plate 31 are closed by the packing 42 to form an airtight chamber. In this condition, the original form film F is brought into contact with the printed circuit board P (refer to FIG. 2A) by the fixed suction plates 21, 22 and the sliding suction plate 31, followed by exposure by the exposure lamp 23.

After exposure, the sliding suction plate 31 of the carrier 3 returns to the registration station 1, and the printed circuit board P already positioned there is carried to the exposure station 2. At the same time, the sliding suction plate 32 of the carrier 3 carries the printed circuit board P exposed at the exposure station 2 to the release station 5. Subsequently, this operation is repeated.

Referring now to FIGS. 3 to 9, an alternative preferred embodiment of the carrier device of the present invention is described. Elements having similar functions to those in the preceding preferred embodiment are here assigned identical symbols and numerals.

Figure 3A:
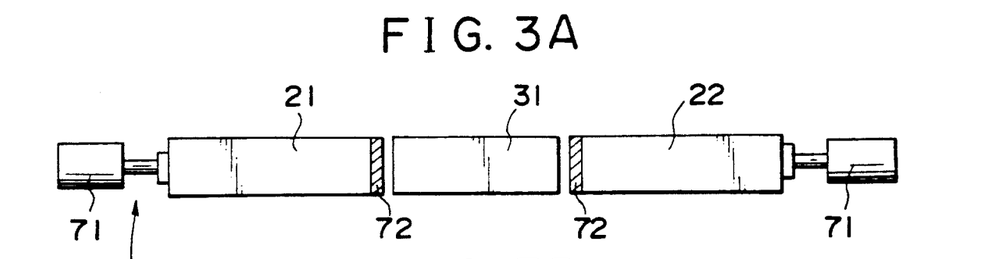
FIG. 3A is a sectional view showing a second preferred embodiment of a carrier of the present invention.
Figure 3B:
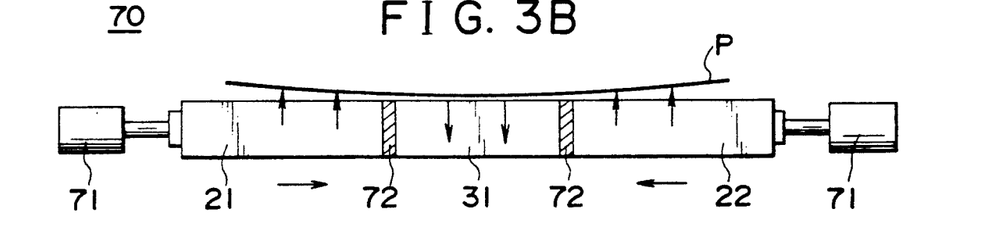
FIG. 3B is a sectional view showing seals established in the second preferred embodiment of the present invention.

In the sealing mechanism 70 of the second preferred embodiment, packings 72 are installed at the end surfaces of the fixed suction plates 21, 22 and seal the gaps by pushing the fixed suction plates 21, 22 against the sliding suction plate 31 by means of an air cylinder 71. At the moment when the fixed suction plates 21, 22 are moved, both sides of the printed circuit board P and the original form film F are lifted using the exhaust air from the air cylinder 71 and can be prevented from loosening, as shown in FIG. 3B.

Figure 4A:
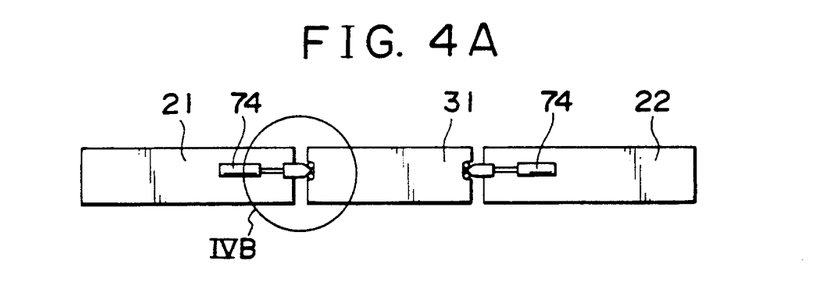
FIG. 4A is a sectional view showing a third preferred embodiment of a carrier of the present invention.
Figure 4B:
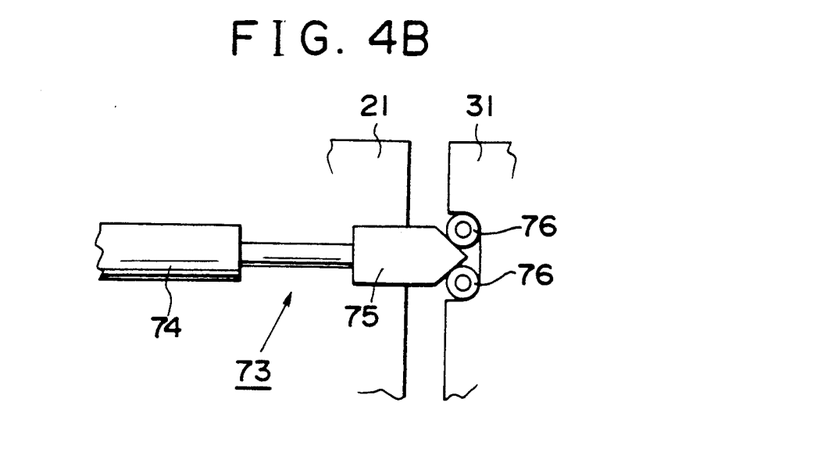
FIG. 4B is an enlarged view showing a section IVB of FIG. 4A.

In a sealing mechanism 73 of a third preferred embodiment, grooves are provided in the end surfaces of the sliding suction plate 31, into which rod-like packings 76 are inserted, and the gaps are sealed by a shutter 75 carried on the rod actuated by the air cylinders 74 installed on the sides of the fixed suction plates 21, 22.

Figure 5A:
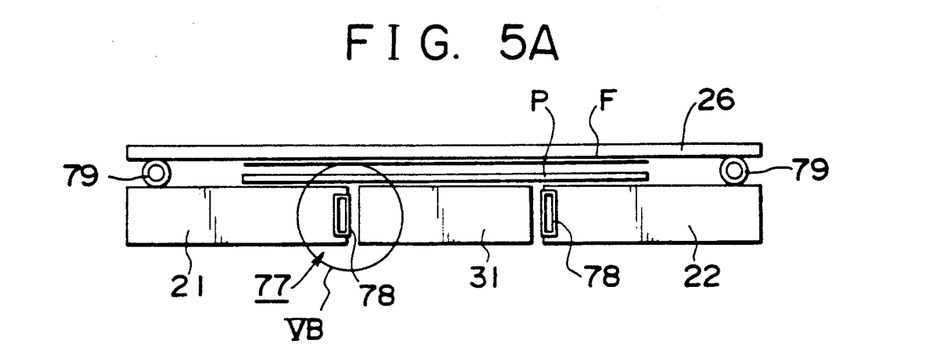
FIG. 5A is a sectional view showing a fourth preferred embodiment of a carrier of the present invention.
Figure 5B:
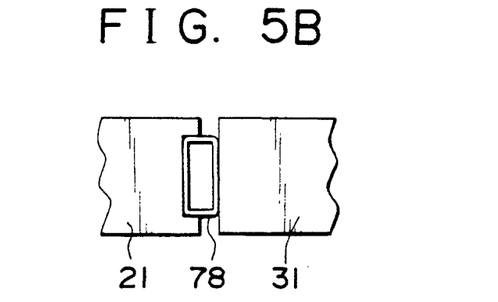
FIG. 5B is an enlarged view showing a section VB of FIG. 5A.

In sealing mechanism 77 of a fourth preferred embodiment shown in FIGS. 5A and 5B, tube-like packings 78 are installed in the end faces of the fixed suction plates 21, 22, and the gaps are sealed by the expansion of the packings by air feed. The air feed and the air release may be coordinated with air feed to and release from the tube-like packings 79 between the fixed suction plates 21, 22 and the transparent support plate 26a.

Figure 6A:
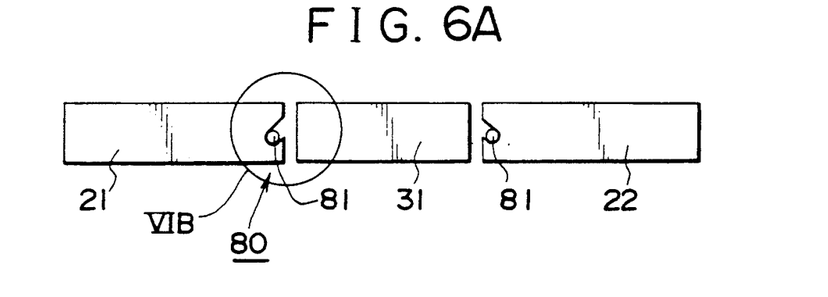
FIG. 6A is a sectional view showing a fifth preferred embodiment of a carrier of the present invention.
Figure 6B:
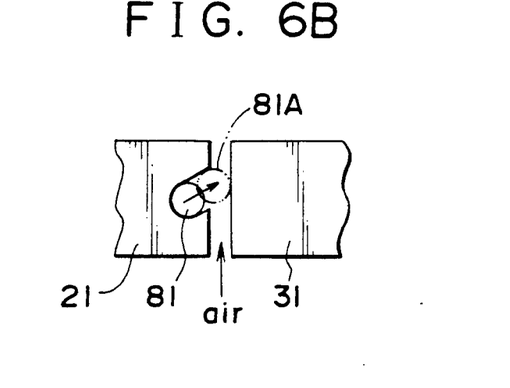
FIG. 6B is an enlarged view showing a section VIB of FIG. 6A.

In sealing mechanism 80 of a fifth preferred embodiment shown in FIGS. 6A and 6B, channels extend obliquely downwards in the end faces of the fixed suction plates 21, 22 and hold rod-like packings 81. When aspirating for bringing into contact each other, air flows in the direction of the arrow from the gaps between the fixed suction plates 21, 22 and the sliding suction plate 31. Therefore, by use of the resulting negative pressure, the gaps are sealed by lifting the packings 81.

Figure 7:
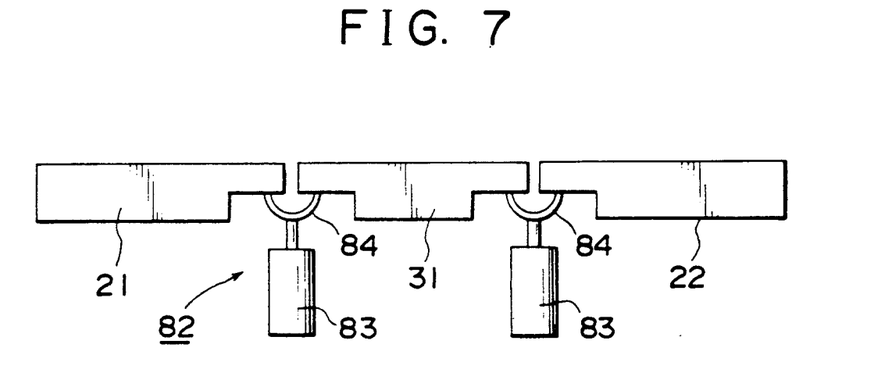
FIG. 7 is a sectional view showing a sixth preferred embodiment of a carrier of the present invention.

In sealing mechanism 82 of a sixth preferred embodiment shown in FIG. 7, the gaps between the fixed suction plates 21, 22 and the sliding suction plate 31 are sealed by extending and retracting the rods of the air cylinders 83 installed below the gaps and compressing and relaxing the packings 84 installed on the distal ends of the rods.

Figure 8:
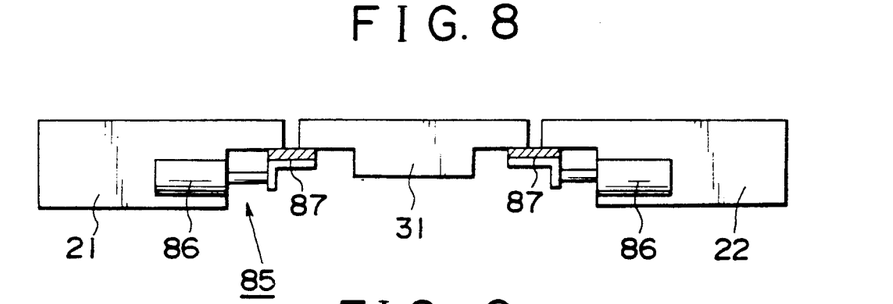
FIG. 8 is a sectional view showing a seventh preferred embodiment of a carrier of the present invention.

In sealing mechanism 85 of a seventh preferred embodiment shown in FIG. 8, the gaps between the fixed suction plates 21, 22 and the sliding suction plate 31 are sealed by extending and retracting the rods of the air cylinders 86 and moving the packings 87 attached to the distal ends of the rods forward and backward.

Figure 9:
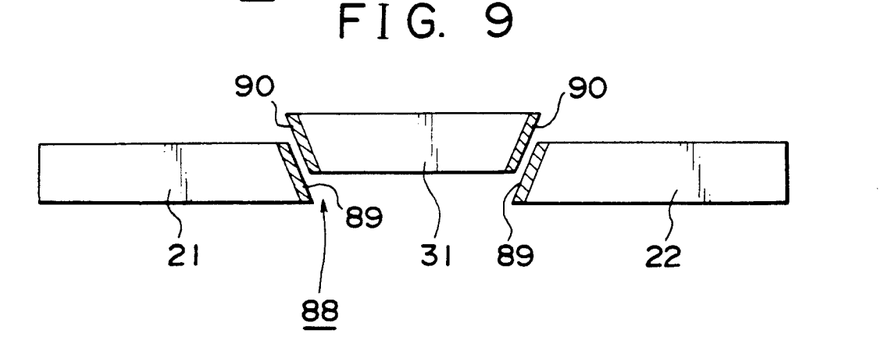
FIG. 9 is a sectional view showing an eighth preferred embodiment of a carrier of the present invention.

In sealing mechanism 88 of an eighth preferred embodiment shown in FIG. 9, the end faces of the fixed suction plates 21, 22 and the sliding suction plate 31 are tapered, with packings 89, 90 adhered thereto, and the gaps are sealed by the motion for varying the upper and lower positions of the fixed suction plates 21, 22 when the sliding suction plate 31 moves.

Figure 10A:
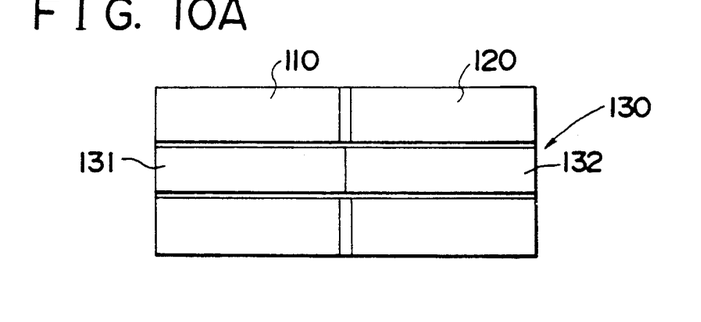
FIG. 10A is a plan view showing a carrier used in a ninth preferred embodiment of the present invention.
Figure 10B:
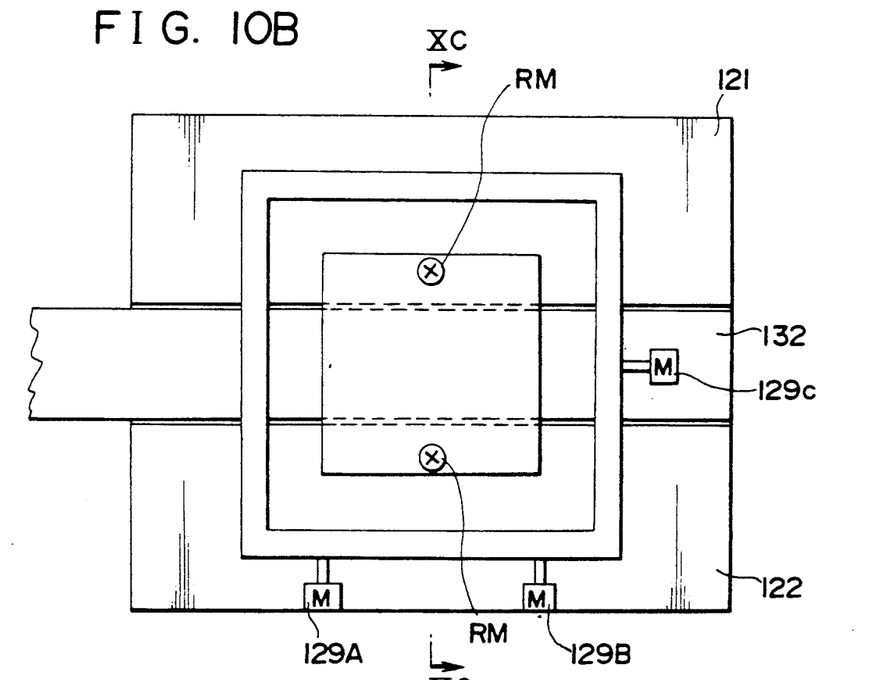
FIG. 10B is a plan view showing a processing station of the ninth preferred embodiment of the present invention.
Figure 10C:
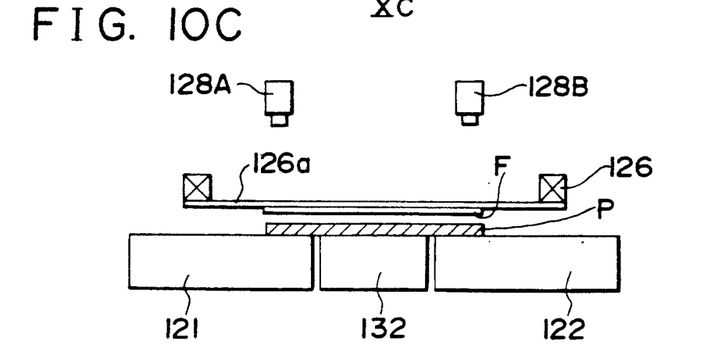
FIG. 10C is a sectional view taken along line XC—XC of FIG. 10B.

FIG. 10A is a plan view showing a carrier as a ninth preferred embodiment of the present invention. FIG. 10B is a plan view mainly showing the processing station of the ninth preferred embodiment of the present invention of FIG. 9. FIG. 10C is a sectional view taken along line XC—XC of FIG. 10B.

The carrier of the ninth preferred embodiment of the present invention comprises a registration station 110, an exposure station 120 and a carrier 130.

In the registration station 110 the rough positioning of the printed circuit board P adhered to the sliding suction plate 132 by vacuum is accomplished only by pushers, stoppers or the like. On a transparent support plate 126a, in turn supported by a frame body 126 in the exposure station 120, the original form film F is glued at the required position. Frame body 126 can be accurately driven by pulse motors 129A, 129B in the direction of θ and by another pulse motor 129C in the direction of X, respectively.

At the upper side of the frame body 126, monitor cameras 128A, 128B (e.g. CCD camera) are arranged and read the registration mark RM indicating positioning of the printed circuit board P and the original form film F carried by the sliding suction plate 31 in the exposure station 120. The pulse motors 129A, 129B, 129C move the frame body 126, following the position signals detected by the monitor cameras 128A, 128B, and accurately register the printed circuit board P and the original form film F.

The sealing mechanisms of the first to eighth preferred embodiments of the present invention can be also applied to such a carrier device.

Without restricting the embodiments of the present invention as herein disclosed, it is to be understood that other variations and modifications of the invention are possible within the scope of the present invention. Although an exposure device was described as an example, other devices may be used when the corresponding operation requires air-tightness at the processing station and furthermore the airtight chamber may be not only under a vacuum but also pressurized. It is possible to mount the sealing mechanism disclosed in each preferred embodiment either on the side of the sliding suction plate or on the side of the fixed suction plate, so long as it does not prevent motion of these components. For example, the packings 72 may be installed in the sides of the sliding suction plate 31.

In the preferred embodiment described in FIGS. 1A, the example included registration station 1, the exposure station 2 and the release station 5, but the carrier device of the present invention can be applied to apparatus without a release station 5. For example, the printer disclosed in Japanese Patent Laid-open No. 1-306245 has separate printing and registration machines, with channels formed in a part of the planar registration table and printing table. A fixed suction plate is formed in the printing table, with a guide rail extending between both of the channels and movably supporting the sliding suction plate. The sliding suction plate is driven by a reversible motor to freely reciprocate with the required stroke corresponding to the distance between the tables. The sliding suction plate has a length which is roughly equal to that of the table for printing and the width may be slightly smaller than that of the channel. Therefore, the release of printed matter is done by a release belt passing through the channel, and thus no release station is required. Even if the carrier of such a printer is used for the exposure device of the first preferred embodiment as is, the sealing mechanism which makes a seal between the sliding suction plate and the fixed suction plate would form apparatus in accordance with the present invention.

Although in the preferred embodiment of FIG. 10C, the monitor cameras 128A, 128B are shown placed at the upper side of the frame body 126, they may be placed at the lower side, with a portion or all of the table (121, 122 or the like) transparent.

What is claimed is:

1. A carrier mechanism for a processing table, said carrier mechanism comprising:
   at least one sliding plate slidably mounted in a groove provided in the upper surface of the processing table and forming a pair of groove sidewalls which extend downwardly from said processing table upper surface, said sliding plate having a pair of opposing planar end faces, each end face being parallel to and facing one of said groove sidewalls, and an upper surface forming a portion of said table surface at a processing station where said table surface is enclosed in an airtight chamber; and
   sealing means for forming seals between each of said end faces of said sliding plate and the facing groove sidewall to close the gap therebetween, said sealing means including seal members coextensive with said airtight chamber and mounted on the processing table for reciprocating movement in a plane parallel to said upper surface of the processing table and reversible drive means for moving said seal member in said parallel plane between an extended position closing said gap and a retracted position opening said gap.

2. A carrier mechanism according to claim 1, wherein said seal member is an elongated flexible belt having parallel edges with one of said parallel edges fixed to a groove sidewall and the other parallel edge being fixed to said reversible drive means, whereby said belt is longitudinally bent with a bent central portion extending toward the facing end face of said sliding plate and being brought into contact with said facing end face of said sliding plate upon movement to said extended position.

3. A carrier mechanism according to claim 1 further comprising a pair of moveable table sections mounted for reciprocating movement in the plane of said upper surface of said processing table and spaced apart to define said groove therebetween, Parallel edges of said moveable table sections defining said groove therebetween and serving as said groove sidewalls and wherein said seal members are fixed to said groove sidewalls.

4. A carrier mechanism in accordance with claim 1 wherein longitudinally extending edge grooves are provided in said end faces of said sliding plate and wherein said sealing means comprises packing fixed in said edge grooves and said seal member is a reciprocating shutter member which seats within said edge grooves in said extended position to form a seal within said packing material.

5. A carrier mechanism in accordance with claim 1 wherein said seal members are elastomeric tubes and wherein said reversible drive means is a source of fluid pressure for inflating and deflating said elastomeric tubes.

6. A carrier mechanism in accordancing with claim 1, wherein said sealing means further includes downwardly extending grooves formed into each of said groove sidewalls and wherein said seal members are longitudinal rods freely moveable within said downwardly extending groove and wherein said reversible drive means comprises means for injecting a gas flow into each of said gaps for forcing said longitudinal rods up into sealing engagement between said groove sidewalls and said sliding plate end faces.

7. A carrier mechanism according to claim 1 wherein said groove sidewalls are end faces of table sections defining said groove therebetween and wherein said seal members are in sliding engagement with bottom surface portions of said table sections and said sliding plate, said seal members covering the bottoms of said gaps in said extended position.

8. A carrier mechanism in accordance with claim 1, wherein said sliding plate is a suction plate having apertures in its upper surface and further comprising means for establishing a vacuum through said apertures to hold a work piece on the upper surface of said sliding plate.

9. A carrier mechanism in accordance with claim 8, wherein said table surface within said airtight chamber is formed by said sliding plate and fixed suction plates on opposite sides thereof, said fixed suction plates having apertured upper surfaces for drawing a vacuum therethrough.

* * * * *